(12) United States Patent
Setzer et al.

(10) Patent No.: US 6,676,784 B2
(45) Date of Patent: Jan. 13, 2004

(54) PROCESS FOR THE MANUFACTURE OF MULTILAYER CERAMIC SUBSTRATES

(75) Inventors: Christopher D. Setzer, Poughkeepsie, NY (US); Harsaran S. Bahatia, Hopewell Junction, NY (US); Raymond M. Bryant, Poughquag, NY (US); Michael S. Cranmer, Poughkeepsie, NY (US); Suresh Kadakia, Poughkeepsie, NY (US); Richard O. Seeger, Hopewell Junction, NY (US); Satyapal Singh Bhatia, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 09/907,391

(22) Filed: Jul. 17, 2001

(65) Prior Publication Data

US 2003/0015277 A1 Jan. 23, 2003

(51) Int. Cl.[7] .............................................. B32B 31/04
(52) U.S. Cl. ...................................... 156/89.12; 29/851
(58) Field of Search ......................... 156/89.12; 29/851

(56) References Cited

U.S. PATENT DOCUMENTS

| | | | | |
|---|---|---|---|---|
| 3,948,706 A | | 4/1976 | Schmeckenbecher | ........ 156/89 |
| 4,443,278 A | * | 4/1984 | Zingher | ........................ 156/64 |
| 5,480,503 A | | 1/1996 | Casey et al. | ................... 156/89 |
| 5,896,650 A | | 4/1999 | Nishide et al. | ................ 29/830 |
| 5,976,286 A | | 11/1999 | Natarajan | ..................... 156/60 |
| 5,976,953 A | | 11/1999 | Zavracky et al. | ........... 438/455 |
| 6,016,005 A | | 1/2000 | Cellarosi | ..................... 257/703 |
| 6,245,171 B1 | * | 6/2001 | Natarajan et al. | ......... 156/89.11 |
| 6,281,452 B1 | * | 8/2001 | Prasad et al. | ................ 174/262 |
| 6,329,609 B1 | * | 12/2001 | Kaja et al. | ................... 174/262 |

OTHER PUBLICATIONS

"Clamping Small Parts with Green Bisque Ceramic", IBM Technical Disclosure Bulletin, Feb. 1983, Abstract, 1 page.

\* cited by examiner

Primary Examiner—Michael W. Ball
Assistant Examiner—John T. Haran
(74) Attorney, Agent, or Firm—Ira Blecker; Cantor Colburn LLP

(57) ABSTRACT

A process for the manufacture of a multilayer ceramic substrate includes fabricating the multilayer ceramic substrate from a monolith fabricated from universal layers and a monolith fabricated from custom layers. The universal layer monolith and the custom layer monolith are then joined to form the complete structure of the MLC substrate.

13 Claims, 2 Drawing Sheets

PROCESS FOR THE MANUFACTURE OF MULTILAYER CERAMIC SUBSTRATES

BACKGROUND OF THE INVENTION

Multilayer ceramic substrates (MLC) are used in the production of electronic substrates and devices. The multilayer ceramic substrate typically includes alternating patterned metal layers sandwiched between ceramic layers. The patterned metal layers act as electrical conductors, whereas the ceramic layers act as a dielectric or insulating medium. For the purposes of interlayer interconnections, most of the ceramic layers have tiny holes or vias filled with an electrically conductive paste containing a low-resistance conductive material such as Ag, Ag/Pd alloy, Cu, or Au. The ceramic and metal layers are sintered to form vias, which provide the electrical connection between layers. In addition, the multilayer ceramic substrates may have termination pads for attaching semiconductor chips, connector leads, capacitors, resistors and the like.

The multilayer ceramic substrates are typically formed from ceramic green sheets in a layer-by-layer process that starts with a fired ceramic layer onto which alternating patterned layers of dielectric and metal conductive layers are sequentially deposited by a screening operation to form the multilayer ceramic structure. The layers can be sintered after each deposition or sintered after all the layers are deposited. Sintering at sufficiently high temperatures consolidates the metal, ceramic and usually glass particles into a dense, impervious monolith that provides mechanical support of the electrically continuous circuit traces formed within the ceramic dielectric. In practice, the layering process can be inefficient and requires the manufacturer to sequentially build the MLC structure from individual layers.

Another method to make multilayer ceramic substrates involves forming the dielectric into a tape by a casting process and punching the tape to form holes or "vias" into which a conductive metal paste is deposited along with metal traces that act as wiring. A number of these punched and metallized tapes are aligned, stacked and pressed into a laminate that is subsequently sintered. Such a methodology is a co-fired process in which the ceramic and metal powders are consolidated in essentially a single but often complex heating process. Similar to the layer by layer process, this type of process can be inefficient and requires the manufacturer to sequentially build the MLC structure from individual layers.

Traditional ceramic substrates are formed of aluminum oxide ($Al_2O_3$) which are typically bonded with a fused glass powder after sintering. Molybdenum and tungsten metal powders are commonly used as the electrical conductor since these materials provide high electrical conductivity while tolerating the high sintering temperatures without melting. Sintering such aluminum oxide ceramic substrates requires temperatures in excess of 1500° C.

Current fabrication of MLC substrates requires each individual layer to be sequentially built to form the complete structure. Consequently, each layer is treated as a custom fabricated layer, which results in inefficiencies and extended cycle times to manufacture the complete multilayer ceramic substrate.

SUMMARY OF THE INVENTION

A process for forming a multilayer ceramic substrate includes forming a universal monolith and a custom monolith. The universal monolith includes a plurality of universal layers and at least one conductive pathway extending therethrough. The universal layers are fabricated using standard design rules and may further include redundant conductive pathways. A bottom surface of the universal monolith is adapted to electrically communicate with a first electrical component. The custom monolith includes a plurality of custom layers and a conductive pathway extending therethrough. The custom layers are fabricated using standard or advanced design rules. An upper surface of the custom monolith is adapted to electrically communicate with a second electrical component. The custom monolith is placed onto the universal monolith and each one of the conductive pathways in the custom monolith is aligned with a corresponding conductive pathway in the universal monolith. The custom monolith and the universal monolith are then bonded together to form the multilayer ceramic substrate, wherein each one of the conductive pathways in the custom monolith is in electrical communication with the corresponding conductive pathway in the universal monolith.

Other objects and a fuller understanding of the invention will be had from the accompanying drawings and detailed description that follows.

DETAILED DESCRIPTION OF PREFERRED EMBODIMENTS

An improved process for the manufacture of a multilayer ceramic substrate includes fabricating the multilayer ceramic substrate from a universal monolith comprised of universal layers and a custom monolith comprised of custom layers. The universal monolith and the custom monolith are then joined to form the complete structure of the MLC substrate.

The term "universal layer" is defined herein as those layers having common designs for different types of manufactured MLC substrates. The universal layers include those layers that generally form the lower portion of the multilayer ceramic substrate and employ standard ground rules and designs. In contrast, the custom layers include customized layers that generally form the upper portion of the multilayer ceramic substrate and are specifically adapted for electronically connecting an electronic component or components to the uppermost surface of MLC. The fabrication and design of the custom layers require standard or advanced ground rules specific for completing the specialized circuitry to permit proper functioning of the electrical components disposed thereon. The custom layers are then joined with and are in electrical communication with the universal layers at an interface to form the complete MLC substrate.

Figure 1:
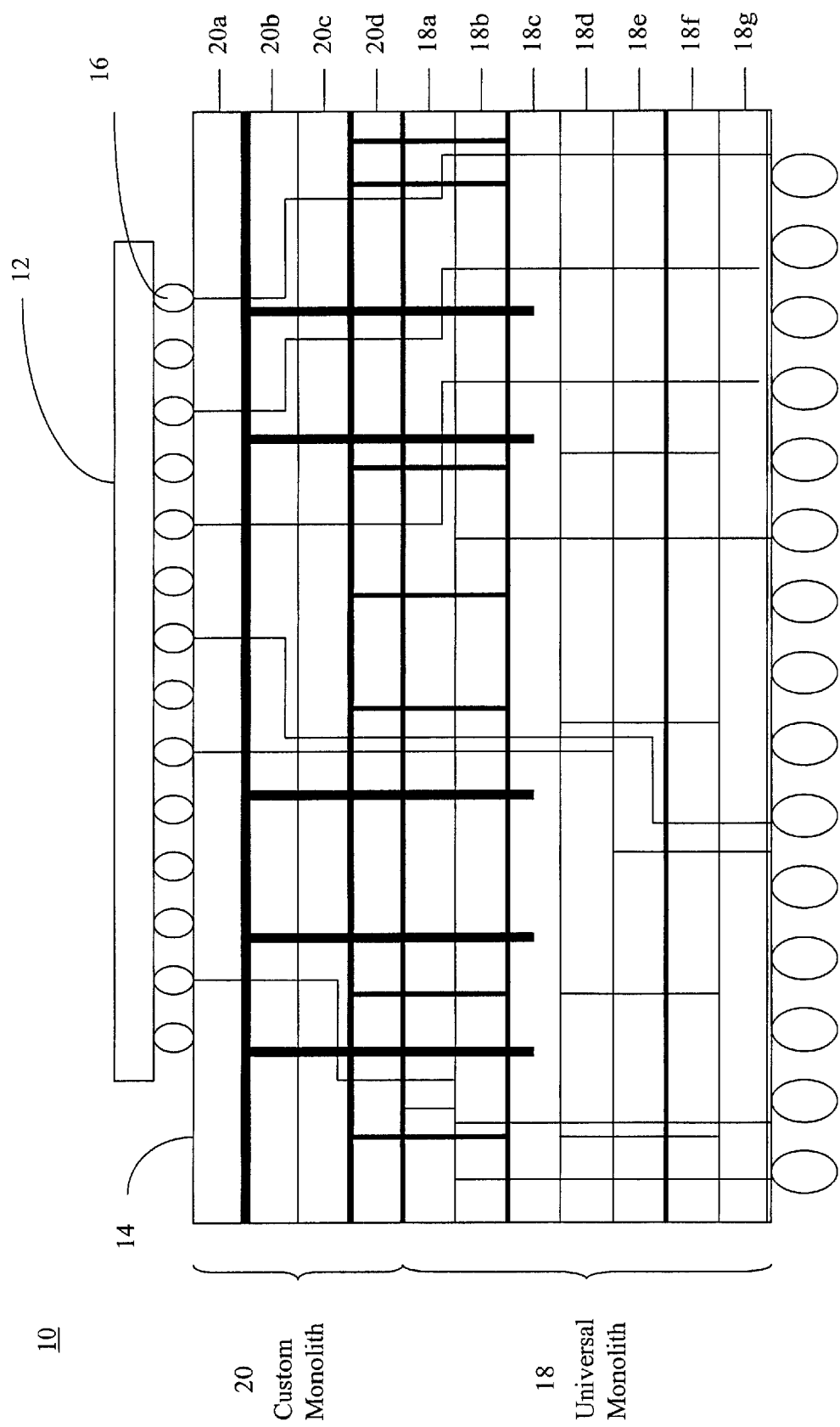
FIG. 1 illustrates a composite multilayer ceramic substrate including universal layers and custom layers.

Turning now to FIG. 1, there is depicted a multilayer ceramic substrate generally designated 10 that includes an electrical component 12 thereon, e.g., a chip, transistor, capacitor, resistors or the like. The illustrated multilayer ceramic substrate 10 includes a monolith of universal layers generally designated 18 and a monolith of custom layers generally designated 20. The electrical component 12 is attached to an uppermost surface 14 of the multilayer ceramic substrate by electrical connectors 16 such as a ball grid array or the like. Electrical connectors 22 are also formed at a lowermost surface of the multilayer ceramic substrate. The electrical connectors 22 are configured to electrically connect the multilayer ceramic substrate and the attached electrical component 12 to a card or board, another chip or another electronic part as is well-known in the art. The electrical connectors 16 and 22 are formed utilizing art recognized processes and techniques.

Figure 2:
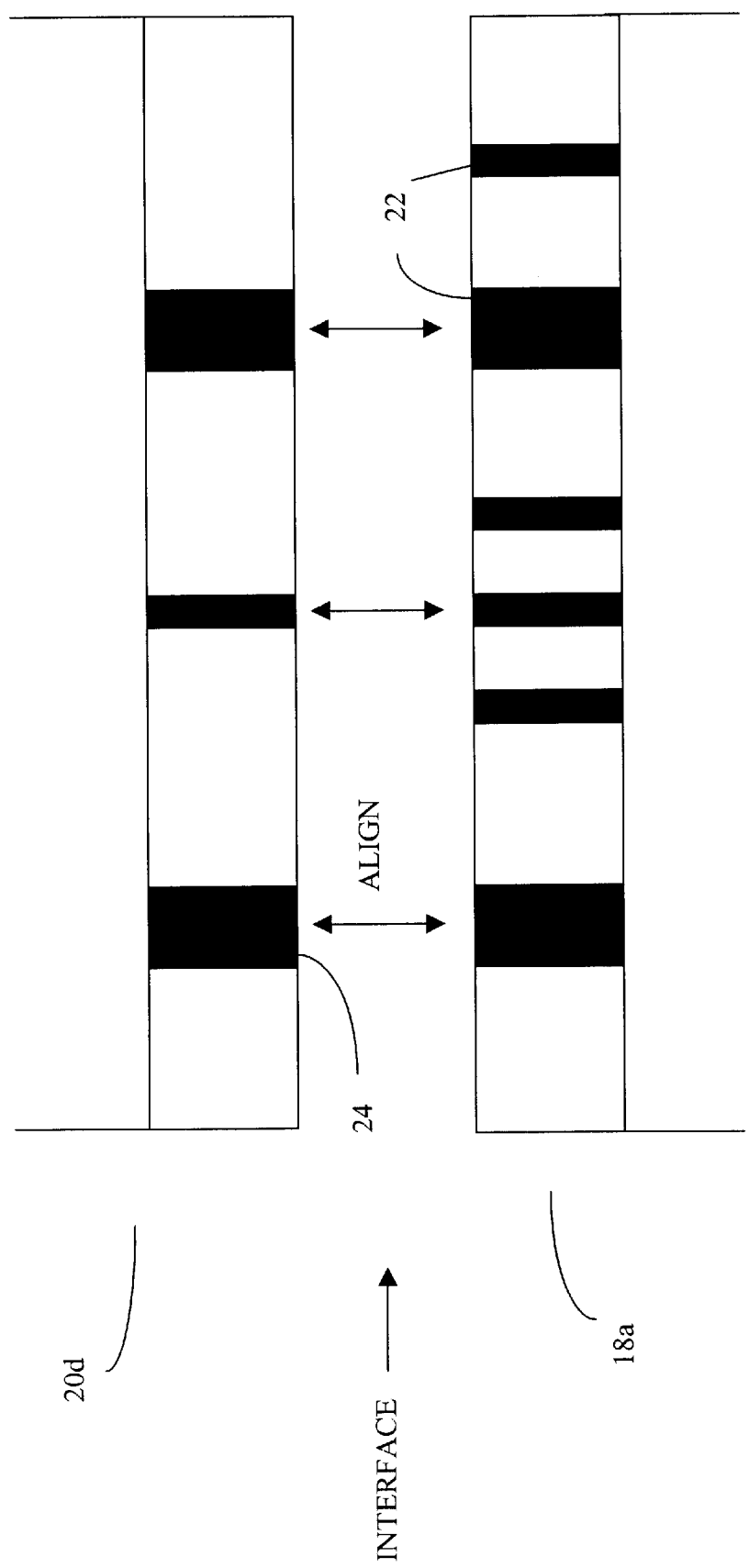
FIG. 2 is a partial exploded view depicting an interface between a custom monolith and a universal monolith.

The custom monolith 20 includes a plurality of customized layers to receive and energize each electrical component 12 disposed thereon. As shown in FIG. 1, four custom layers 20a, 20b, 20c and 20d are depicted. The number of illustrated custom layers is exemplary only and will depend on the particular design employed, such as the number and type of electrical components disposed thereon. As such, the number of custom layers may be greater or less than four layers. Preferably, the number of custom layers ranges in an amount from 3 to 5 layers. The uppermost layer 20a of the custom monolith 20 is designed for providing a conductive pathway for attaching the specific electronic components 12 and may require standard or advanced design rules for defining the wiring pattern. That is, custom layer 20a is designed to provide a conductive footprint for the specific electrical components and as such, includes conductive wiring contacts aligned with respective conductive wiring contacts in each electrical component 12. Electrical connectors 16 provide contact between the components 12 and the multilayer ceramic substrate 10. Custom layer 20d is configured to provide wiring contacts for connection to the underlying monolith of universal layers 18. The wiring contacts 22 may be in the form of conductive vias, lines, contacts or the like. As shown in FIGS. 1 and 2, layer 20d will be electrically connected to some or all of the conductive contacts in top universal layer (18a) of the underlying monolith of universal layers 18. Custom layers 20b and 20c provide conductive pathways between the wiring contacts of layers 20a and 20d. The thickness of the custom layers 20 is preferably the same as or less than the thickness of the universal layers 18.

The universal monolith 18 is designed to include a plurality of universal layers, i.e, stock layers. In FIG. 1, these universal layers are labeled 18a–18g. The number of illustrated universal layers is exemplary only. Preferably, the number of universal layers ranges from 8 to 10 layers. The universal layers 18 employ standard ground rules and are configured to provide continuous conductive pathways between each layer. As shown in FIG. 2, layer 18a is designed with conductive vias, lines, contacts 24 or the like to electrically connect the universal monolith 18 to the custom monolith 20. The conductive vias 22 in the layer 18a are configured to be adaptable to provide electrical communication to any design of the monolith of custom layers 20. Thus, layer 18a may have redundant conductive vias or the like for connecting different custom monoliths 20. Custom layer 20d in the custom monolith 20 is aligned with and bonded to the corresponding conductive pathways in universal layer 18a, thereby forming a multilayer ceramic substrate.

Generally, each layer in the multilayer ceramic substrate is formed from an individual green sheet. The green sheets are preferably prepared from a slurry of ceramic particulate material, thermoplastic polymer binders, plasticizers and solvents. This composition is spread or cast into ceramic sheets or slips from which the solvents are subsequently volatilized to provide coherent and self-supporting flexible green sheets. The green sheets include vias into which a conductive metal paste is deposited along with metal traces that act as wiring. After punching, metal paste screening, stacking and laminating, the green sheets are fired or sintered at temperatures sufficient to burn off or remove unwanted polymeric binder and sinter the ceramic particulate together into a densified monolith or multilayer ceramic substrate.

The process for forming multilayer ceramic substrates includes fabricating a number of universal layers 18a–g from the green sheets, wherein each layer employs standard ground rules to define the wiring patterns. The universal layers 18a–g are stacked and then exposed to a sintering process to form a monolith 18 of universal layers. Optionally, each layer may be sintered after deposition. Large quantities of universal layer monoliths 18 can be fabricated and stored indefinitely, thereby significantly reducing cycle time. Moreover, mask utilization for the universal layers is increased due to the increased volume.

The custom monoliths 20 may be formed in like manner from ceramic materials or alternatively, with materials and processes used for forming thin films. For example, multiple layers of thin film are built up on a glass plate using art recognized procedures. Each layer is customized for a particular intended application, such as forming a power structure or signal wiring. Thin film processes employ photolithographic processes that permit greater wiring densities compared to the use of ceramic layers. Consequently, the wiring in the ceramic layers under the thin film structure may be reduced. The entire thin film structure is then lifted off the glass plate and attached to the top of a ceramic substrate including an appropriate footprint for attachment to a universal monolith or alternatively, may be attached directly to the universal monolith. An electrical component or chip is then attached to the top of the thin film structure. This two part structure is now the overall chip package.

The universal and custom monoliths, 18 and 20 respectively, can be fabricated in parallel and then joined to form the complete multilayer ceramic substrate. Advantageously, the manufacturer can fabricate the custom layer monolith on an as needed basis and join the custom monolith to an existing inventory of universal monoliths to form the complete multilayer ceramic substrate. Fabrication in this manner is commercially advantageous.

The custom and universal monoliths may be joined together by solder balls on a surface of one of the monoliths to corresponding pads on the surface of the other monolith. Control Collapse Chip Connection is an interconnect technology developed by IBM as an alternative to wire bonding. This technology is generally known as C4 technology or flip chip packaging. In the C4 interconnect technology, a relatively small solder bump is attached to pads on one of the monolith being joined. The electrical and mechanical interconnects are then formed by positioning the corresponding pads on the other monolith adjacent the solder bumps and reflowing the bumps at elevated temperature. The C4 joining process is self-aligning in that the wetting action of the solder will align the chip bump pattern to the corresponding substrate pads.

Other art recognized processes to join the monoliths can be used, such as, for example, the monoliths can be bonded with a fused glass powder after sintering. Other bonding processes, such as lamination or wire bonding processes, will be apparent to those skilled in the art in view of this disclosure.

Alternatively, the multilayer ceramic substrate may be joined by co-firing previously manufactured "unfired" custom and universal layers together. Large quantities of each individual universal layer can be made and stored in inventory as an unfired substrate. The manufacturer may then use this inventory to fabricate a complete multilayer ceramic substrate with customized layers. The use of this process permits the manufacturer to fabricate small quantities of multilayer ceramic substrates, wherein the custom layers are adapted to operate highly specialized electronic components. Advantageously, yields are increased and cycle times reduced by use of stock universal layers.

The advantages of employing the process for fabricating multilayer ceramic substrates includes, but are not limited to, the following: design time for each individual chip footprint is reduced; the use of universal layers eliminates the need for the chip designer to incorporate these layers into the design; the designer designs only the customized layers for the particular electronic components, i.e., custom layers; a single masterslice module including a number of universal layers could be employed for different body sizes and in accordance with JEDEC (Joint Electronic Device Engineering Council); the interface between the universal layers and the custom layers would remain fixed; the thin film (TF) is used on a limited area of the top surface metal (TSM) pads thereby reducing material costs; the masterslice modules including the universal layers can be built in large quantity and inventories for an indefinite period of time; the masterslice module including the universal layers and the custom layers can be built in parallel and joined at a later time; capacitor locations can be at a fixed location for a given body size; the universal layers can be used for a variety of technologies such as FR4, thin film, ceramic, etc; redundant I/O can be used for test purposes; and more reliable electrical performance can be obtained.

The electrically conductive material forming the conductive pathways is preferably selected from the group comprising copper, aluminum, molybdenum, nickel, tungsten, and metal with glass frit. The material for the ceramic green sheet is preferably selected from the group comprising alumina, alumina with glass frit, borosilicate glass, aluminum nitride, and glass ceramic. Other suitable conductive materials and/or ceramic materials will be apparent to those skilled in the art in view of this disclosure.

While preferred embodiments have been shown and described, various modifications and substitutions maybe made thereto by one skilled in the art without departing from the spirit and scope of the invention. Accordingly, it is understood that the present invention has been described by way of illustration only, and such illustrations and embodiments as have been disclosed herein are not to be construed as limiting the scope of the claims.

What is claimed is:

1. A process for forming a multilayer ceramic substrate, the process comprising:

forming a universal monolith comprised of a plurality of self-supporting universal ceramic layers, wherein the universal monolith includes at least one conductive pathway extending therethrough and wherein a lowermost surface is adapted to electrically communicate with a first electrical component;

forming a custom monolith comprised of a plurality of self-supporting custom ceramic layers, wherein the custom monolith includes a conductive pathway extending therethrough and wherein an uppermost surface is adapted to electrically communicate with a second electrical component;

placing the custom monolith onto the universal monolith and aligning each one of the conductive pathways in the custom monolith with a corresponding conductive pathway in the universal monolith; and bonding the custom monolith to the universal monolith to form a multilayer ceramic substrate, wherein a continuous conductive pathway extends therethrough.

2. The process according to claim 1, wherein the conductive pathway comprises an electrically conductive material selected from the group consisting of copper, aluminum, molybdenum, nickel, tungsten, and mixtures thereof.

3. The process according to claim 1, wherein the conductive pathway comprises a conductive metal with glass frit.

4. The process according to claim 1, wherein the ceramic layer comprises a material selected from the group consisting of alumina, alumina with glass frit, borosilicate glass, aluminum nitride, glass ceramic and mixtures thereof.

5. The process according to claim 1, wherein the conductive pathway comprises a feature selected from the group consisting of a cap, a line and a via.

6. The process according to claim 1, wherein the universal monolith and customized monolith are fabricated in a parallel.

7. The process according to claim 1, wherein the first electrical component is a circuit board.

8. The process according to claim 1, wherein the universal monolith includes a redundant conductive pathway.

9. A process for forming a multilayer ceramic substrate, the process comprising:

forming at least one self-supporting universal layer, wherein the at least one universal layer includes an electrically conductive feature formed on a ceramic green sheet;

forming at least one self-supporting custom layer, wherein the at least one custom layer includes an electrically conductive feature formed on a ceramic green sheet adapted to electrically communicate with an electrical component disposed thereon;

placing the at least one custom layer onto the at least one universal layer to form a stack, wherein the electrically conductive features in the universal layer and the custom layer are aligned to form a conductive pathway therethrough; and sintering the stack at a temperature effective to form a monolithic multilayer ceramic substrate, wherein an upper portion of the monolithic multilayer ceramic substrate includes the at least one custom layer and is adapted to receive and energize an electrical component disposed thereon and, wherein a lower portion of the substrate includes the at least one universal layer and is adapted to be attached to a power source.

10. The process according to claim 9, wherein the ceramic green sheet comprises a material selected from the group consisting of alumina, alumina with glass frit, borosilicate glass, aluminum nitride, glass ceramic and mixtures thereof.

11. The process according to claim 9, wherein the conductive pathway comprises an electrically conductive material selected from the group consisting of copper, aluminum, molybdenum, nickel, tungsten, metal with glass frit and mixtures thereof.

12. The process according to claim 9, wherein the conductive pathways comprise a feature selected from the group consisting of a cap, a line and a via.

13. A process for forming a multilayer ceramic substrate, the process comprising:

forming a universal monolith comprised of a plurality of universal ceramic layers, wherein the universal monolith includes at least one conductive pathway extending therethrough and wherein a lowermost surface is adapted to electrically communicate with a first electrical component;

forming a custom monolith comprised of a plurality of custom ceramic layers, wherein the custom monolith includes a conductive pathway extending therethrough and wherein an uppermost surface is adapted to electrically communicate with a second electrical component;

placing the custom monolith onto the universal monolith and aligning each one of the conductive pathways in the custom monolith with a corresponding conductive pathway in the universal monolith; and forming solder balls on a surface of one of the monoliths and a corresponding pad on a surface of the other monolith, and reflowing the solder balls at an elevated temperature to bond the custom monolith to the universal monolith and form a multilayer ceramic substrate, wherein a continuous conductive pathway extends therethrough.

* * * * *